(12) United States Patent
Mandlik et al.

(10) Patent No.: US 9,991,463 B2
(45) Date of Patent: Jun. 5, 2018

(54) ELECTRONIC DEVICES WITH IMPROVED SHELF LIVES

(71) Applicant: Universal Display Corporation, Ewing, NJ (US)

(72) Inventors: Prashant Mandlik, Lawrenceville, NJ (US); Ruiqing Ma, Morristown, NJ (US); Siddharth Harikrishna Mohan, Plainsboro, NJ (US)

(73) Assignee: Universal Display Corporation, Ewing, NJ (US)

( * ) Notice: Subject to any disclaimer, the term of this patent is extended or adjusted under 35 U.S.C. 154(b) by 102 days.

(21) Appl. No.: 13/917,137

(22) Filed: Jun. 13, 2013

(65) Prior Publication Data

US 2013/0334510 A1    Dec. 19, 2013

Related U.S. Application Data

(60) Provisional application No. 61/659,662, filed on Jun. 14, 2012.

(51) Int. Cl.
| | |
|---|---|
| *H01L 51/50* | (2006.01) |
| *H01L 51/52* | (2006.01) |
| *H01L 51/54* | (2006.01) |

(52) U.S. Cl.
CPC .......... *H01L 51/5203* (2013.01); *H01L 51/50* (2013.01); *H01L 51/5253* (2013.01); *H01L 51/52* (2013.01); *H01L 51/5212* (2013.01)

(58) Field of Classification Search
CPC .................. H01L 51/5072–51/5225
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,293,546 A * | 3/1994 | Tadros .................... | G02F 1/155 359/266 |
| 5,703,436 A | 12/1997 | Forrest et al. | |
| 5,707,745 A | 1/1998 | Forrest et al. | |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

"Process and Design of a Multilayer Thin Film Encapsulation of Passive Matrix OLED Displays," L. Moro, T.A. Krajewski, N. M. Rutherford, O. Philips, R. J. Visser, Vitex Systems, 2004.*

(Continued)

*Primary Examiner* — Maliheh Malek
(74) *Attorney, Agent, or Firm* — Morris & Kamlay LLP

(57) ABSTRACT

Embodiments of the present invention provide electronic devices such as OLEDs that have enhanced mechanical integrity and prolonged shelf, by minimizing the spread of a delamination region using topographical non-uniformities introduced in the device structure. For example, a device may be made deliberately non-planar by introducing multiple energy barriers which can prevent or minimize the propagation of a delamination, because the delamination will have to cross the energy barriers in order to spread to a larger area.

28 Claims, 11 Drawing Sheets

(56) References Cited

U.S. PATENT DOCUMENTS

| | | | | |
|---|---|---|---|---|
| 5,711,824 | A * | 1/1998 | Shinohara | H01L 31/022425 136/256 |
| 5,834,893 | A | 11/1998 | Bulovic et al. | |
| 5,844,363 | A | 12/1998 | Gu et al. | |
| 6,013,982 | A | 1/2000 | Thompson et al. | |
| 6,080,030 | A * | 6/2000 | Isaka et al. | 445/24 |
| 6,087,196 | A | 7/2000 | Sturm et al. | |
| 6,091,195 | A | 7/2000 | Forrest et al. | |
| 6,097,147 | A | 8/2000 | Baldo et al. | |
| 6,294,398 | B1 | 9/2001 | Kim et al. | |
| 6,303,238 | B1 | 10/2001 | Thompson et al. | |
| 6,337,102 | B1 | 1/2002 | Forrest et al. | |
| 6,339,289 | B1 * | 1/2002 | Fork | H01L 51/5203 313/500 |
| 6,433,355 | B1 * | 8/2002 | Riess et al. | 257/40 |
| 6,433,487 | B1 * | 8/2002 | Yamazaki | H01L 27/3281 136/261 |
| 6,468,819 | B1 | 10/2002 | Kim et al. | |
| 6,597,111 | B2 * | 7/2003 | Silvernail et al. | 313/506 |
| 6,630,684 | B2 * | 10/2003 | Lee | H01L 51/5275 257/40 |
| 6,670,772 | B1 * | 12/2003 | Arnold et al. | 315/169.3 |
| 6,831,407 | B2 * | 12/2004 | Cok | H01L 51/5268 313/504 |
| 7,071,617 | B2 * | 7/2006 | Utsumi | H01L 51/52 313/498 |
| 7,084,565 | B2 * | 8/2006 | Cho | H01L 51/5262 313/504 |
| 7,176,621 | B2 * | 2/2007 | Do | H05B 33/10 313/498 |
| 7,279,704 | B2 * | 10/2007 | Walters | C09K 11/06 257/40 |
| 7,332,232 | B2 * | 2/2008 | Ma et al. | 428/690 |
| 7,431,968 | B1 | 10/2008 | Shtein et al. | |
| 7,595,586 | B2 * | 9/2009 | Oh et al. | 313/504 |
| 7,598,115 | B2 * | 10/2009 | Song et al. | 438/99 |
| 7,786,665 | B2 * | 8/2010 | Nakanishi | H01L 51/5275 257/40 |
| 7,800,295 | B2 * | 9/2010 | D'Andrade et al. | 313/504 |
| 7,847,311 | B2 * | 12/2010 | Kim | 257/99 |
| 7,968,146 | B2 | 6/2011 | Wagner et al. | |
| 7,994,710 | B2 * | 8/2011 | Jeon et al. | 313/504 |
| 8,179,034 | B2 * | 5/2012 | Potts | B82Y 20/00 313/504 |
| 8,395,305 | B2 * | 3/2013 | Fujimoto | G02F 1/133502 313/110 |
| 8,569,948 | B2 * | 10/2013 | Wolk et al. | 313/506 |
| 8,697,254 | B2 * | 4/2014 | Shi | H01L 51/50 252/301.16 |
| 8,698,177 | B2 * | 4/2014 | Lee et al. | 257/98 |
| 8,809,842 | B2 * | 8/2014 | Song et al. | 257/40 |
| 9,194,545 | B2 * | 11/2015 | Inada | G02B 5/0252 |
| 2001/0001485 | A1 * | 5/2001 | Bao et al. | 257/89 |
| 2001/0019242 | A1 * | 9/2001 | Tada | H01L 51/5262 313/504 |
| 2001/0038102 | A1 * | 11/2001 | Kawase | 257/98 |
| 2002/0079835 | A1 * | 6/2002 | Lee | H05B 33/10 313/506 |
| 2002/0118271 | A1 * | 8/2002 | Mashimo | H01L 51/5262 347/241 |
| 2003/0062520 | A1 * | 4/2003 | Toguchi | H01L 27/322 257/40 |
| 2003/0076589 | A1 * | 4/2003 | Suleski et al. | 359/558 |
| 2003/0098647 | A1 * | 5/2003 | Silvernail et al. | 313/506 |
| 2003/0117067 | A1 * | 6/2003 | Roitman | H01L 51/5262 313/504 |
| 2003/0230337 | A1 * | 12/2003 | Gaudiana | H01G 9/2031 136/256 |
| 2003/0230980 | A1 | 12/2003 | Forrest et al. | |
| 2004/0017152 | A1 * | 1/2004 | Hashimoto | H01L 27/3246 313/505 |
| 2004/0033675 | A1 * | 2/2004 | Fleming | B32B 17/10 438/482 |
| 2004/0070335 | A1 * | 4/2004 | Cok | H01L 51/5262 313/506 |
| 2004/0085018 | A1 * | 5/2004 | Kuo | 313/506 |
| 2004/0087252 | A1 * | 5/2004 | Huang | 451/41 |
| 2004/0174116 | A1 | 9/2004 | Lu et al. | |
| 2004/0217702 | A1 * | 11/2004 | Garner | H01L 51/5262 313/512 |
| 2004/0227462 | A1 * | 11/2004 | Utsumi | H01L 51/52 313/506 |
| 2005/0023974 | A1 * | 2/2005 | Chwang et al. | 313/512 |
| 2005/0045900 | A1 * | 3/2005 | Silvernail | 257/99 |
| 2005/0088084 | A1 * | 4/2005 | Cok | 313/506 |
| 2005/0141240 | A1 * | 6/2005 | Hata et al. | 362/600 |
| 2005/0194892 | A1 * | 9/2005 | Lu | 313/504 |
| 2006/0007552 | A1 * | 1/2006 | Takakuwa | B82Y 30/00 359/619 |
| 2006/0030074 | A1 * | 2/2006 | Mund et al. | 438/108 |
| 2006/0054893 | A1 * | 3/2006 | Nathan | G09G 3/3233 257/72 |
| 2006/0065904 | A1 * | 3/2006 | Uemura | H01L 51/5268 257/84 |
| 2006/0082285 | A1 * | 4/2006 | Wu et al. | 313/503 |
| 2006/0097629 | A1 * | 5/2006 | Son | 313/504 |
| 2006/0175960 | A1 * | 8/2006 | Noh et al. | 313/505 |
| 2007/0019410 | A1 * | 1/2007 | Kim et al. | 362/235 |
| 2007/0052353 | A1 * | 3/2007 | Yang | H01L 51/0013 313/506 |
| 2007/0079869 | A1 * | 4/2007 | Yukinobu | H01G 9/2022 136/263 |
| 2007/0096642 | A1 * | 5/2007 | Lee | H01L 27/3244 313/506 |
| 2007/0210309 | A1 * | 9/2007 | Cho et al. | 257/59 |
| 2007/0210702 | A1 * | 9/2007 | Nakamura | 313/506 |
| 2007/0290225 | A1 * | 12/2007 | Lee et al. | 257/103 |
| 2007/0290608 | A1 * | 12/2007 | Choi et al. | 313/504 |
| 2007/0292986 | A1 * | 12/2007 | Fujii | 438/99 |
| 2008/0024402 | A1 * | 1/2008 | Nishikawa | H01L 51/5209 345/82 |
| 2008/0081105 | A1 * | 4/2008 | Suh et al. | 427/58 |
| 2008/0100202 | A1 * | 5/2008 | Cok | 313/503 |
| 2008/0116460 | A1 * | 5/2008 | Choi | 257/66 |
| 2008/0121887 | A1 * | 5/2008 | Choi et al. | 257/66 |
| 2008/0176041 | A1 * | 7/2008 | Sato et al. | 428/161 |
| 2008/0220265 | A1 * | 9/2008 | Xia et al. | 428/447 |
| 2008/0238295 | A1 * | 10/2008 | Takei et al. | 313/499 |
| 2008/0258605 | A1 * | 10/2008 | Yukinobu | 313/504 |
| 2008/0265757 | A1 * | 10/2008 | Forrest | H01L 51/5275 313/504 |
| 2009/0057657 | A1 * | 3/2009 | Lee et al. | 257/40 |
| 2009/0066241 | A1 * | 3/2009 | Yokoyama | H05B 33/22 313/504 |
| 2009/0230384 | A1 * | 9/2009 | Meng et al. | 257/40 |
| 2010/0136724 | A1 * | 6/2010 | Mary et al. | 438/26 |
| 2010/0141123 | A1 * | 6/2010 | Joo | H01L 27/322 313/504 |
| 2010/0150513 | A1 * | 6/2010 | Zhang | B82Y 20/00 385/131 |
| 2010/0187984 | A1 * | 7/2010 | Lin et al. | 313/504 |
| 2010/0300529 | A1 * | 12/2010 | Kawahara | H01G 9/2031 136/256 |
| 2010/0315576 | A1 * | 12/2010 | Chung et al. | 349/62 |
| 2011/0001420 | A1 * | 1/2011 | Tchakarov | H01L 51/5212 313/355 |
| 2011/0114931 | A1 * | 5/2011 | Lee et al. | 257/40 |
| 2011/0151607 | A1 * | 6/2011 | Landis et al. | 438/46 |
| 2011/0171447 | A1 * | 7/2011 | Krishnamoorthy et al. | 428/220 |
| 2011/0253987 | A1 * | 10/2011 | Chung et al. | 257/40 |
| 2011/0278548 | A1 * | 11/2011 | Takezoe | B29D 11/00365 257/40 |
| 2011/0279027 | A1 * | 11/2011 | Boerner | 313/504 |
| 2012/0021548 | A1 * | 1/2012 | Yamazaki | C23C 14/12 438/46 |
| 2012/0091488 | A1 * | 4/2012 | Vermersch | C03C 17/007 257/98 |
| 2012/0103660 | A1 * | 5/2012 | Gupta et al. | 174/126.2 |
| 2012/0132897 | A1 * | 5/2012 | Seki | G02B 5/1809 257/40 |

(56) References Cited

U.S. PATENT DOCUMENTS

| | | | |
|---|---|---|---|
| 2012/0161614 A1* | 6/2012 | Boerner | H01L 27/3239 313/504 |
| 2012/0223634 A1* | 9/2012 | Xia | C09K 11/06 313/504 |
| 2012/0235178 A1* | 9/2012 | Mori | H01L 27/3211 257/88 |
| 2013/0000952 A1* | 1/2013 | Srinivas et al. | 174/126.1 |
| 2013/0004750 A1* | 1/2013 | Majumdar | H01L 51/0022 428/202 |
| 2013/0004753 A1* | 1/2013 | Majumdar et al. | 428/209 |
| 2013/0032204 A1* | 2/2013 | Gaudiana | H01L 31/02243 136/256 |
| 2013/0056876 A1* | 3/2013 | Harvey | H01L 51/003 257/773 |
| 2013/0108840 A1* | 5/2013 | Ivanov et al. | 428/195.1 |
| 2013/0146875 A1* | 6/2013 | Mandlik | H01L 51/5234 257/52 |
| 2013/0157446 A1* | 6/2013 | Lifka et al. | 438/479 |
| 2013/0177732 A1* | 7/2013 | Lee et al. | 428/76 |
| 2013/0240861 A1* | 9/2013 | Nakamura et al. | 257/40 |
| 2014/0001450 A1* | 1/2014 | Shinotsuka et al. | 257/40 |
| 2014/0008628 A1* | 1/2014 | Yamana et al. | 257/40 |
| 2014/0027753 A1* | 1/2014 | Yamana et al. | 257/40 |
| 2014/0049923 A1* | 2/2014 | Ma et al. | 361/748 |
| 2014/0103336 A1* | 4/2014 | Lee et al. | 257/43 |
| 2014/0151651 A1* | 6/2014 | Jin et al. | 257/40 |
| 2014/0167017 A1* | 6/2014 | Shinotsuka et al. | 257/40 |
| 2014/0225091 A1* | 8/2014 | O'Carroll et al. | 257/40 |
| 2014/0306213 A1* | 10/2014 | Sato | H01L 51/5275 257/40 |
| 2014/0332794 A1* | 11/2014 | Birnstock et al. | 257/40 |
| 2014/0361270 A1* | 12/2014 | Cui et al. | 257/40 |
| 2015/0001470 A1* | 1/2015 | Ma et al. | 257/40 |
| 2015/0041787 A1* | 2/2015 | Malik | H01L 51/445 257/40 |
| 2015/0171371 A1* | 6/2015 | Jeon | H01L 51/5268 257/40 |
| 2015/0179971 A1* | 6/2015 | Yamana | H01L 51/5012 257/40 |
| 2015/0311474 A1* | 10/2015 | Basil | H01L 51/5012 257/40 |
| 2016/0254493 A1* | 9/2016 | Sun | H01L 51/56 257/40 |

OTHER PUBLICATIONS

"Enabling Technology for OLED Displays," John McMahon, Vitex Systems, 2003.*

Baldo, et al., "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, vol. 75, No. 1, pp. 4-6, Jul. 5, 1999.

Chang, et al., "Highly Efficient Blue-Emitting Iridium(III) Carbene Complexes and Phosphorescent OLEDs", Angew. Chem. Int. Ed. 47, pp. 4542-4545, 2008.

Lacour, et al., "Stretchable Interconnects for Elastic Electronic Surfaces", Proceedings of the IEEE, 93, 1459, 2005.

Mandlik, et al., "Fully Elastic Interconnects on Nanopatterned Elastomeric Substrates", IEEE Electron Device Letters, vol. 27, No. 8, Aug. 2008.

McMahon, et al., "Thin film encapsulation and flexible barrier substrates for OLED displays", Vltex Systems, OLEDAsia 2004, 2004.

Salbek, et al., "Low molecular organic glasses for blue electroluminescence", Synethic Metals 91, 209-215, 1997.

Schaer, et al., "Water Vapor and Oxygen Degradation Mechanisms in Organic Light Emitting Diodes", Adv. Funct. Mater, vol. 11, No. 2, p. 116, 2001.

Tung, et al., "Highly Efficient Red Phosphorescent Osmium(II) Complexes for Oled Applications", Organometallics, 23, pp. 3745-3748, 2004.

* cited by examiner

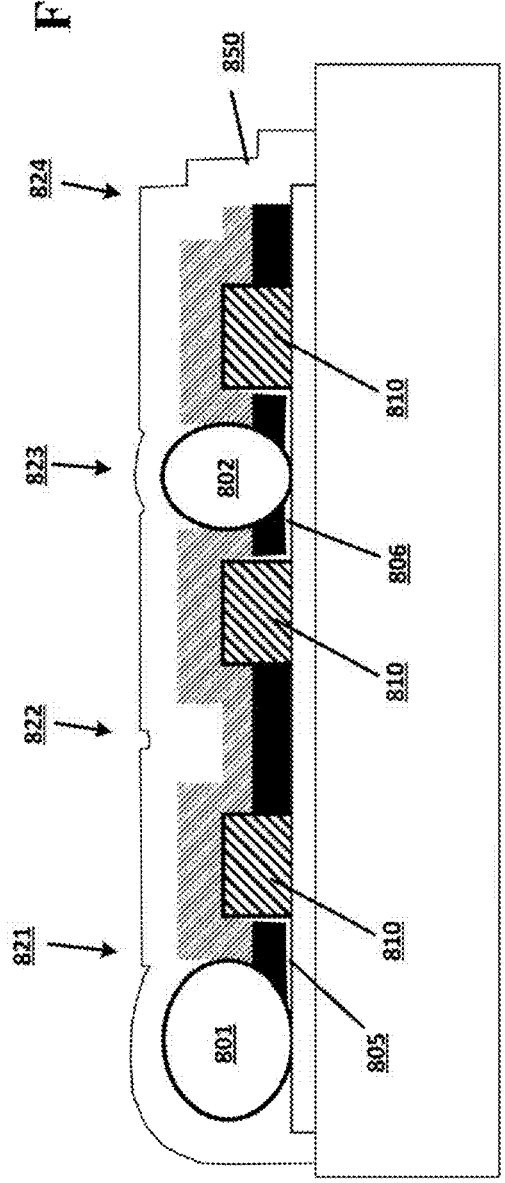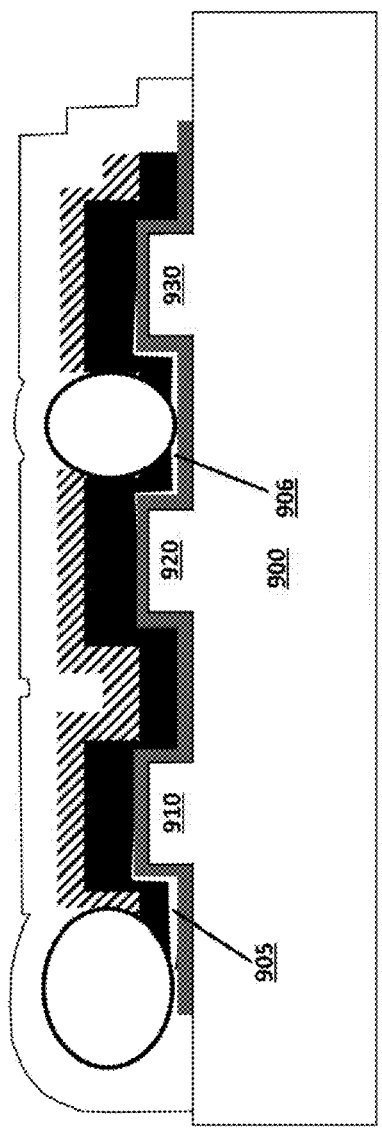

ELECTRONIC DEVICES WITH IMPROVED SHELF LIVES

PRIORITY

The present application claims priority to U.S. Provisional Patent Application No. 61/659,662, filed Jun. 14, 2012, the disclosure of which is incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to electronic devices such as OLEDs and, more specifically, to devices and techniques for fabricating devices having improved shelf lives and mechanical integrity.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

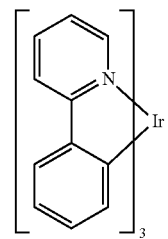

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Embodiments of the invention provide electronic devices such as OLEDs that include a topographically non-planar layer that prevents or reduces the spread of delamination regions within the device. In an embodiment, a device includes a substrate, a first electrode disposed over the substrate, an organic emissive layer disposed over the first electrode, a second electrode disposed over the organic emissive layer, a barrier film disposed over the first electrode, the organic emissive layer, and the second electrode, and which is in conformal contact with a layer immediately below the barrier film, and a topographically non-planar layer disposed between the substrate and the barrier film. The non-planar layer may be disposed between the anode and the organic emissive layer, between the substrate and the organic emissive layer, adjacent to the organic emissive layer, adjacent to the first electrode, immediately over the substrate, and/or at other locations within the device. It may be a physically distinct and separate layer, or it may be physically integral with another layer, such as where physical features extend from another layer such as a substrate. It also may be formed by one or more grooves within an existing layer, such as a substrate. Each layer disposed over the non-planar layer may topographically follow the contour of the non-planar layer. In a specific arrangement, the device may include a substrate; an anode disposed over the substrate; a topographically non-planar layer disposed over the anode; an organic emissive layer disposed over the non-planar layer; a cathode disposed over the organic emissive layer; and a barrier film disposed over and in conformal contact with the cathode.

In an embodiment, the organic emissive layer may include a plurality of pixels. The non-planar layer may physically separate individual pixels within the organic emissive layer. The non-planar layer may include a grid or similar structure. The non-planar layer may include various materials such as metals, organics, and/or inorganics. The organic emissive layer may be a blanket layer or it may include multiple, distinct regions such as pixels.

In an embodiment, the non-planar layer may include a topographical non-uniformity having an upper portion that extends over and beyond a lower portion. The barrier film, organic layer, and/or other layers may conformally coat the topographical non-uniformity, such as where the layer is disposed directly over the non-uniformity, and/or it may follow the contour of the non-uniformity, such as where intervening layers are disposed between the layer and the non-uniformity. One or more regions under the upper portion of the topographical non-uniformity may remain unfilled by layers disposed over the non-uniformity, such as thin film barriers, organic emissive layers, and the like.

BRIEF DESCRIPTION OF THE DRAWINGS

FIG. 8 shows a schematic cross-section of an OLED device with topographical non-uniformity introduced in form of grid according to an embodiment of the invention.

FIG. 9 shows a schematic cross-section of an OLED device with a topographical non-planar layer incorporated into a substrate layer according to an embodiment of the invention.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
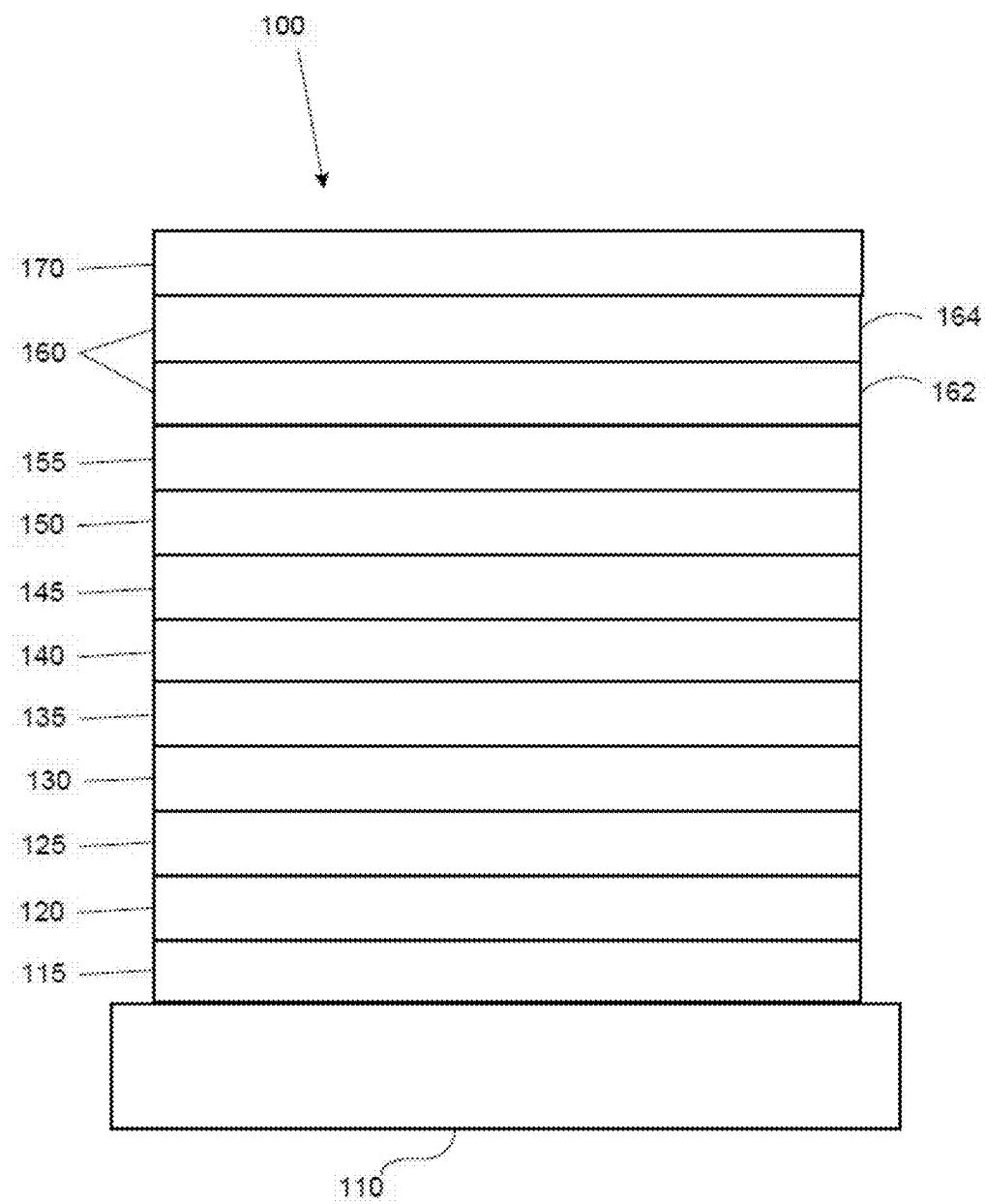
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
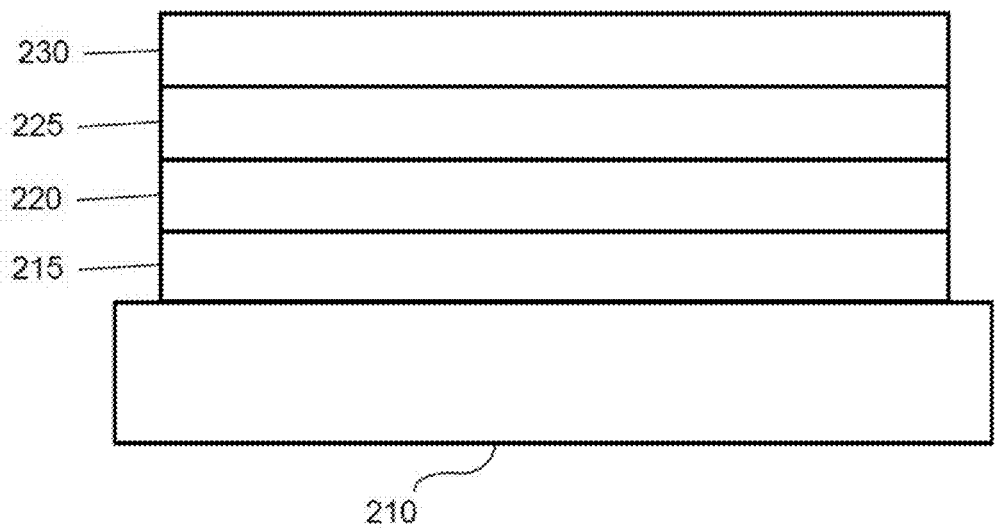
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

Electronic devices that are sensitive to atmospheric gases, such as OLEDs, often may degrade upon storage via formation of dark spots in the active device area. These dark spots typically are caused by either formation of an insulating layer at the cathode-organic interface, and/or delamination of one or both of the cathode-organic and the anode-organic interface. One reason for delamination of cathode-organic interface is the formation of gases like $H_2$ when water vapor reacts with the metallic cathode. The release of $H_2$ enables the creation of an affected area which often is much larger than that of the cathode which is actually consumed by the water vapor by direct chemical reaction. The delamination spreads as more cathode reacts with water vapor, forming more $H_2$ gas. Delamination of the organic-anode interface is also often observed. In such cases a conformally coated thin film barrier layer, along with the cathode and organic layers, may delaminate from the anode, thus causing the device to fail.

As previously described, the delamination of two films to result in formation of two detached surfaces requires energy. If the driving force for the formation of two new surfaces is greater than the energy of formation of the new total surface area, then the interface delaminates. Similar to the formation and propagation of cracks in a surface, if the energy at the tip of the crack is somehow diffused, a greater amount of energy is required to propagate the crack.

A technique of putting energy barriers in the path of cracks to slow down their propagation has been utilized by Mandlik et al., 2006 to obtain electrical conductors with suppressed crack propagation upon stretching. When thin gold conducting lines are deposited on polydimethylsiloxane (PDMS) with thin Cr films sandwiched in between, the resulting structure can be stretched to many tens of percent of strain as shown by Stephanie P. Lacour et al., 2005. This strain is higher than the degree to which a free standing metal film can be stretched. However, upon stretching, the electrical resistance of such conducting lines increases due to the propagation of micro-cracks in the lines. The increase in the resistance of these conductors can be prevented if the free propagation of micro-cracks is suppressed. If the crack propagation is suppressed to the extent that the increase in the resistance of the conductor is purely because of the thinning of the conductor, the conductor may be considered as being deformed purely elastically.

For uni-axial elastic stretching of a metal conductor with dimensions $l_o \times w_o \times t_o$ along the length, to final dimensions $l \times w \times t$, the strain along the length is $\epsilon_l = (l-l_o)/l_o$, so $l = l_o(1+\epsilon)$. If the Poisson's ratio is $v$, then $w = w_o(1-v\epsilon)$ and $t = t_o(1-v\epsilon)$. The initial value of resistance of the metal piece is given by, $$R_0 = \rho \left( \frac{l_o}{t_o \times w_o} \right) \qquad (1)$$

where is ρ the resistivity of the metal.

The final value of the resistance after the stretching is given by, $$R = \rho\left(\frac{l}{t \times w}\right) \quad (2)$$

After substituting the values of l, w and t, we obtain, $$R = R_o \frac{(1 + \varepsilon)}{(1 - v\varepsilon)^2} \quad (3)$$

This ratio $R/R_o$ for the change in the resistance with applied strain is obtained for a metal conductor that is stretched elastically. It represents the minimum possible variation in the resistance that can be achieved when a metal conductor is stretched. Mandlik et al. utilized the energy barriers in crack suppression to obtain such a variation in electrical resistance of the gold conductors. Without the use of these barriers, upon stretching, it was found that the cracks propagated freely across the conductor, causing the resistance of the conductor to rise profusely upon stretching as described by Stephanie P. Lacour et al, 2005.

The pattern made to suppress crack propagation in the conductor was a two dimensional array of nano-sized pyramidal hillocks on the surface of the elastomeric substrate, with the metal conductor deposited on top of patterned PDMS. (P. Mandlik et al. 2006). Individual metal conductors were then stretched uni-axially. Resistance and load values were recorded. Electrical contacts of conducting epoxy paste with thin gold wires set in were used to measure the electrical resistance, and the variation of resistance ($R/R_o$) with respect to applied strain for various samples was plotted. It was found that the change in resistance for the samples without tilt was nearly similar to that of the microcracked samples reported by Stephanie P. Lacour et al, 2005. However, for the samples with-tilt, the variation of resistance was nearly the same as the elastic stretching of metal conductors obtained by Eq. (3), taking ν to be 0.42 for thin gold films calculated up to 25% of applied strain.

The SEM inspection of the stretched samples revealed a drastic difference in the topography of the samples with- and without-tilt. Samples without-tilt showed random Y-shaped cracks with length on the order of a couple micrometers. The microstructure was similar to that of microcracked samples reported by Stephanie P. Lacour et al, 2005. Delamination of gold was observed in the bases of some pyramids. On the other hand, samples with pyramids obstructing the propagation of cracks showed localized cracks with length on the order of a couple hundred nanometers. The orientation of cracks seemed to be random. In these samples, the orientation of the pyramidal array was chosen such that pyramids act as obstacles in propagation of cracks, and the sample cracks were localized to smaller lengths. It was found that there was no straight path available for the cracks to propagate in the transverse direction, which is the most facilitated direction for their progress in uni-axial stretching. In other words, disorienting the pyramidal array with respect to the transverse direction reduced the typical lengths of the cracks and rendered them localized.

In contrast to the work by Mandlik and Lacour, embodiments of the present invention provide enhanced mechanical integrity and prolonged shelf life of OLEDs or similar moisture-sensitive electronic devices encapsulated with a conformally-coated thin film barrier, by minimizing the spread of a delamination region using topographical non-uniformities in the device structure. For example, a device may be made deliberately non-planar by introducing multiple energy barriers which can prevent or minimize the propagation of a delamination, because the delamination will have to cross the energy barriers in order to spread to a larger area.

Figure 3:
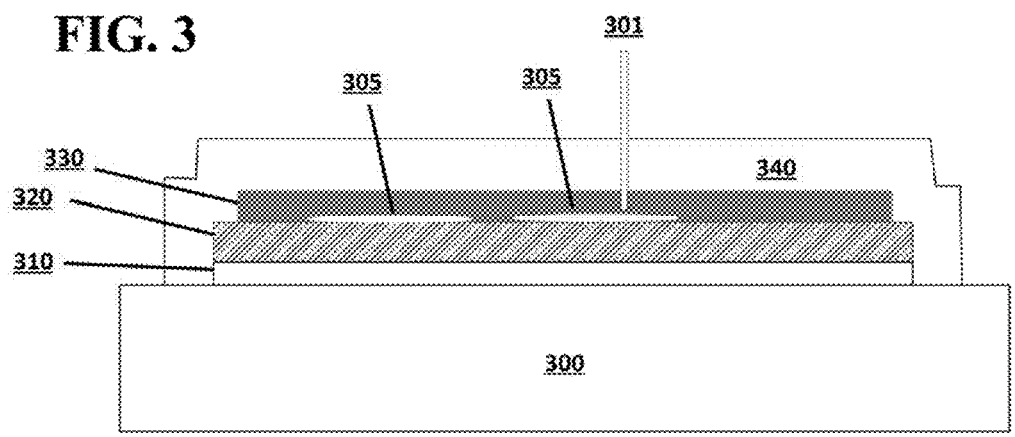
FIG. 3 shows a schematic cross-section of an OLED device without any topographical feature introduced in the device to pixelate the device.

FIG. 3 shows a schematic cross-section of a planar OLED device with an anode 310, organic layers 320, a cathode 330 and a conformally-coated thin film barrier 340 disposed over a substrate 300. Water vapor which permeates across the barrier film, 301, reaches the cathode and travels across the cathode via defects in the cathode. As it passes across the cathode, it reacts with the cathode. Upon reaching the cathode-organic interface, the vapor spreads and reacts with the cathode at the interface to form an insulating layer and delamination-causing gases, causing one or more delamination regions 305. As previously described, in the absence of any energy barrier, the delamination region 305 spreads to and through the surrounding area. This leads to an increase in the size of the delamination region and the associated dark spot in the OLED.

In contrast to the structure shown in FIG. 3, embodiments of the invention may provide one or more topographical features in the device structure that prevent the spread of a delamination area. In an embodiment, an electronic device such as an OLED is provided that includes a substrate, a first electrode disposed over the substrate, an organic emissive layer disposed over the first electrode, a second electrode disposed over the organic emissive layer, a barrier film disposed over the first electrode, the organic emissive layer, and the second electrode and in conformal contact with a layer immediately below the barrier film, and a topographically non-planar layer disposed between the substrate and the barrier film.

Figure 4:
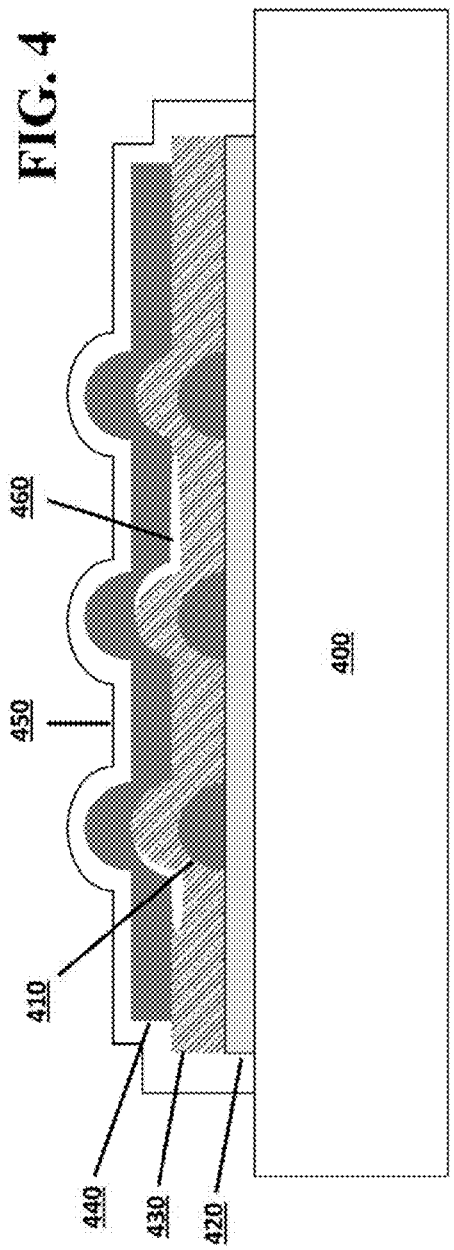
FIG. 4 shows a schematic cross-section of an OLED device with a topographical non-uniformity introduced in form of Al buslines according to an embodiment of the invention.

The topographically non-planar layer may include, for example, a grid structure disposed over the anode. FIG. 4 shows a schematic example of such a configuration. The example device includes a topographically non-planar layer formed by a square mesh of an Al metal grid 410 disposed over the planar anode 420. Organic layers 430, the cathode 440, and the encapsulation 450 are disposed over the non-planar Al grid layer 410, and the encapsulation layer is in conformal contact with the cathode. In this configuration, the water vapor which permeates across the barrier film reaches the non-planar cathode. It travels across the cathode via defects as previously described, reacting with cathode. Upon reaching the cathode-organic interface, the vapor may react with the cathode at the interface to form an insulating layer and delamination-causing gases. In contrast to the structure illustrated in FIG. 3, in this configuration the delamination region 460 is forced to remain localized because of the presence of the energy barrier. That is, the Al grid buslines which make up the non-planar layer prevent the further spread of the delamination. In some cases, a delamination may still spread but at a significantly slower rate.

When a grid or similar structure as shown in FIG. 4 is used, the grid may be covered by another insulating grid to prevent the device from shorting. A grid as used in FIG. 4 may be Al or any other suitable material, including metals, organic materials, inorganic materials, or any combinations thereof. In this configuration, the primary function of the Al grid 410 is to introduce topographical non-uniformities in the device to act as barriers in the propagation path of delamination regions 460 as previously described. In configurations such as shown in FIG. 4, the non-planar layer 460 may be disposed between the substrate 400 and an organic emissive layer, such that the organic emissive layer follows the contour of the non-planar layer. It may be disposed immediately adjacent to, i.e., in contact with, the organic emissive layer, or other intervening layers may be disposed between the non-planar layer and the organic emissive layer. The non-planar layer also may be disposed below the anode or, as shown in FIG. 4, above the anode 420, and/or between the anode 420 and the organic emissive layer. The non-planar layer 410 also may be adjacent to the electrode, such as where it is used to provide bus lines, or intervening layers may be present.

Figure 5:
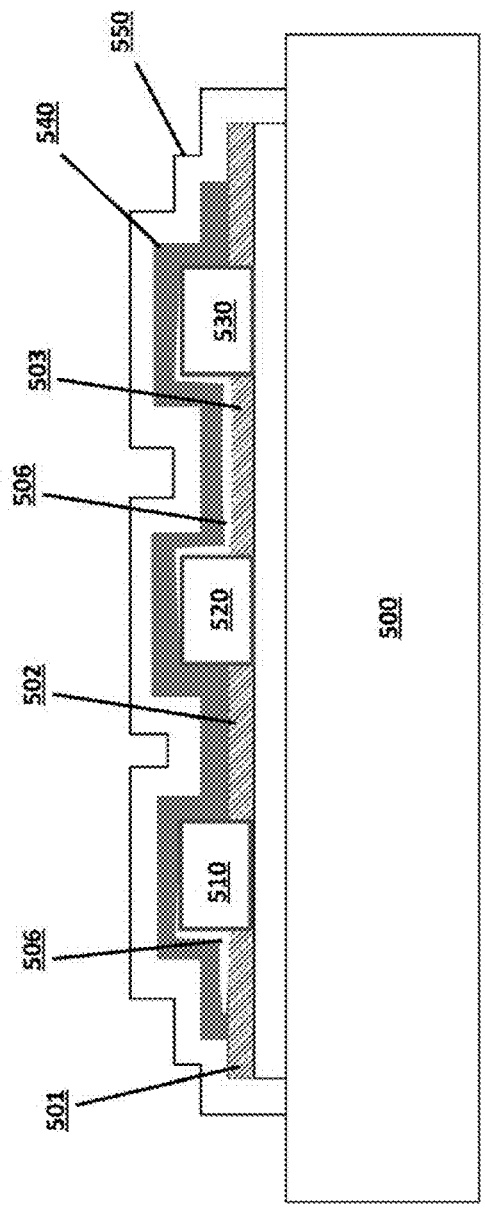
FIG. 5 shows a schematic cross-section of an OLED device with topographical non-uniformity introduced in form of grid according to an embodiment of the invention.
Figure 6:
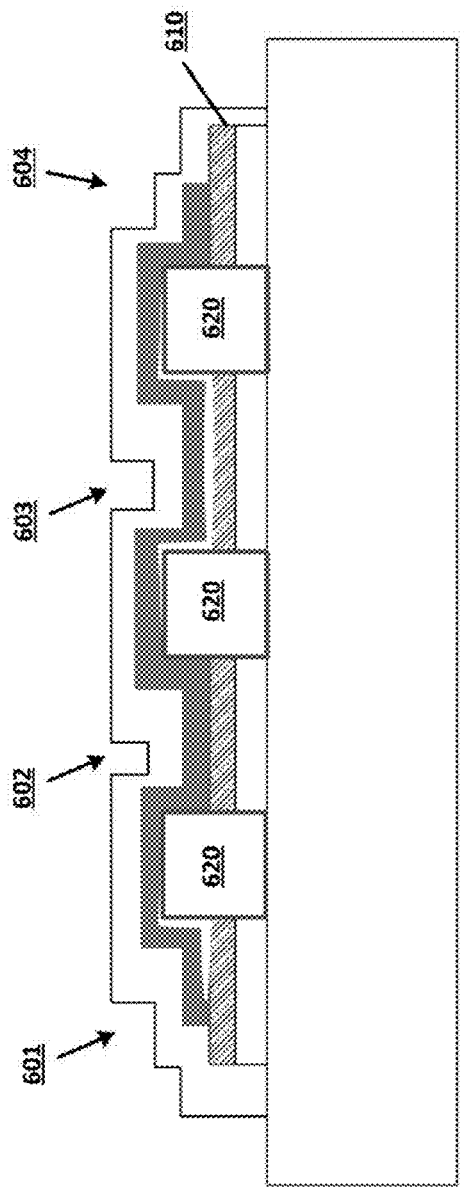
FIG. 6 shows a schematic cross-section of an OLED device with topographical non-uniformity introduced in form of grid according to an embodiment of the invention.

The organic emissive layer may be a blanket layer, or it may include multiple pixels or sub-pixels, i.e., individually-addressable units of emissive layer material. FIG. 5 shows an example device in which the topographically non-planar layer includes multiple topographical features in the form of a grid structure deposited over the anode. The organic layer includes multiple pixels 501, 502, 503, which may be deposited individually or as a blanket layer over the substrate 500. That is, the non-planar layer formed by the grid may physically separate individual pixels within the organic emissive layer. A blanket-layer cathode 540 and a conformally-coated barrier 550 film are disposed over the organic layer. As with the configuration shown in FIG. 4, the presence of the topographical features 510, 520, 530 prevents delamination areas 505, 506 from spreading past the topographical features 510, 520, 530, thus preventing or reducing the formation of dark spots in the device. FIG. 6 shows a similar configuration in which the anode also pixelated, i.e., in which the anode layer 610 includes multiple, physically-distinct and/or individually-addressable regions 601, 602, 603, 604. As previously described, the grid 620 may be metallic, organic, inorganic or any combinations thereof. If the grid is metallic, an insulating layer may be disposed on top of the grid to prevent anode-cathode contact. That is, although the grid may be made of a conductive material, the primary function of the grid is to introduce topographical non-uniformity in the device to act as a barrier in the propagation path of delamination regions.

The pixelation of the organic layers may improve the mechanical integrity of the overall device. Due to a general lack of adhesion to the underlying inorganic anode, organic layers may be particularly prone to delamination. The use of an organic layer that includes multiple, physically-separate regions may prevent a localized delamination within one such region from significantly affecting other regions.

Figure 7:
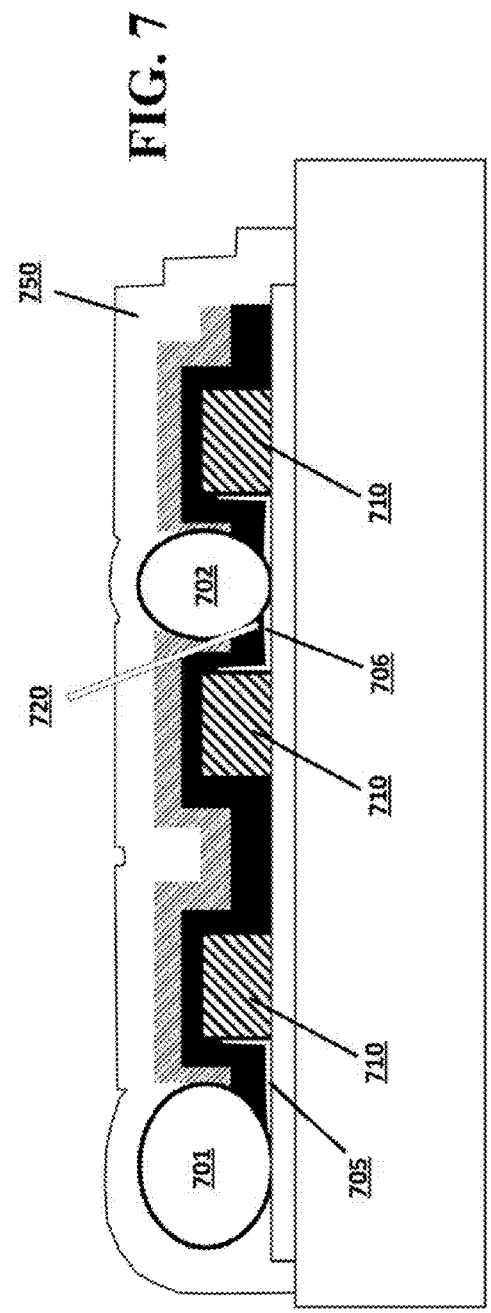
FIG. 7 shows a schematic cross-section of an OLED device with a topographical non-uniformity introduced in form of grid according to an embodiment of the invention.

Delamination in an electronic device such as an OLED may result from internal stresses of one of the device layers, or it may be caused by external forces such as the thin film barrier or ingress of moisture via a particle. Similar to the configurations previously described with respect to moisture ingress through existing layers, in some embodiments the use of a topographically non-planar layer may prevent or reduce delamination caused by moisture ingress resulting from the presence of a foreign particle. FIG. 7 shows an embodiment of the invention in which delamination of a blanket organic layer caused by a moisture permeation 720 allowed by a foreign particle 701, 702 is limited or prevented due to the presence of a topographically non-planar layer. FIG. 8 shows a similar embodiment in which the organic layer includes multiple pixels 821, 822, 823, 824, and in which foreign particles 801, 802 allow for moisture ingress to the device. In both configurations, the energy barrier of the non-planar layer 710, 810 provides mechanical support to the device, which may prevent delamination areas 705, 706, 805, 806 from spreading, and/or reduce the speed at which such a delamination can spread. The principle of operation of the energy barrier against the progress of a delamination is explained in further detail below. As previously described, each device shown in FIGS. 7 and 8 includes a barrier film 750, 850, respectively.

In some embodiments, the topographical non-planar layer may be incorporated into, or may be a part of, another layer in the device. For example, the topographical non-planar layer may be incorporated into the substrate or another layer of the device as a groove-like or similar feature in the layer. That is, instead of protruding above the plane of a layer on which the topographical non-planar layer is disposed, the topographical non-planar layer may be embedded within another layer of the device. Such a configuration performs a similar function as a protruding layer as previously described, by creating an energy barrier in the path of a delamination to prevent or limit the spread of the delamination. As another example, the topographical non-planar layer may include features that are a part of an existing layer. FIG. 9 shows an example configuration in which the topographical non-planar layer is provided by topographical features 910, 920, 930 on the surface of the substrate 900, and the other layers are deposited over the substrate and the incorporated topographical features. Functionally such a configuration provides the same energy barrier or barriers as a physically-separate layer that is deposited directly on the substrate, and thus operates to prevent or reduce the spread of delamination regions 905, 906 in the device. As used herein, a substrate such as the substrate shown in FIG. 9 may be described as including two layers: a planar layer such as the main portion of the substrate 900, and a topographically non-planar layer above the planar layer that includes features that are non-planar relative to the planar layer, such as features 910, 920, 930, though in fabrication the substrate may be obtained or deposited as a single layer.

Figure 10:
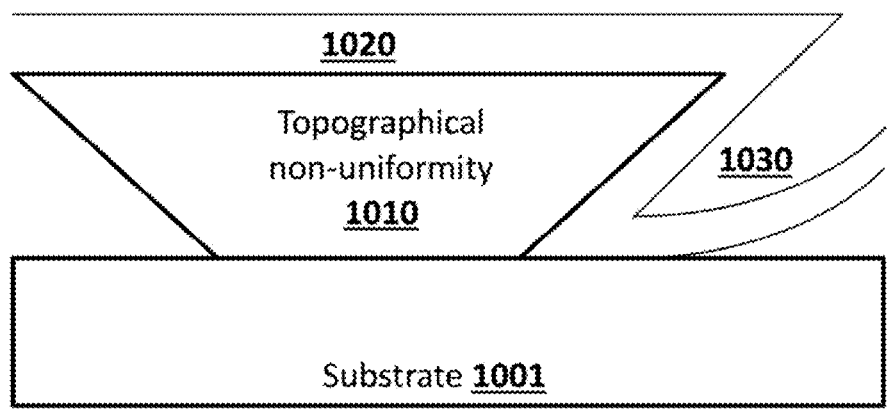
FIG. 10 shows a schematic cross-section of a wall of a topographical non-uniformity that makes an acute angle with a substrate layer according to an embodiment of the invention.

In some configurations, a topographically non-planar layer may include one or more topographical non-uniformities, such as the bus lines described with respect to FIG. 4, the substrate extensions described with respect to FIG. 9, or the like. As another example, a non-planar layer may include topographical non-uniformities that expand in size farther away from the substrate. An example of such a non-uniformity is illustrated in FIG. 10. A topographical non-uniformity 1010 is disposed over a substrate 1001. As previously described, the non-uniformity 1010 may be disposed directly over the substrate 1001, integrated with the substrate 1001, or there may be intervening layers between the substrate 1001 and the non-uniformity 1010. The non-uniformity has an upper portion, located farther away from the substrate, which extends over and beyond the lower portion that is closer to the substrate. A barrier film, emissive layer, or other layer 1020 may be disposed over the non-uniformity such that it conformally coats the non-uniformity, when disposed directly over the non-uniformity, or such that it follows the contour of the non-uniformity, when there are intervening layers between the non-uniformity 1010 and the layer 1020. Notably, a region 1030 under the upper portion of the topographical non-uniformity is not filled by the layer 1030. This may further prevent the development or spread of delamination regions in the layer 1020

Experimental and Modeling

Figure 11:
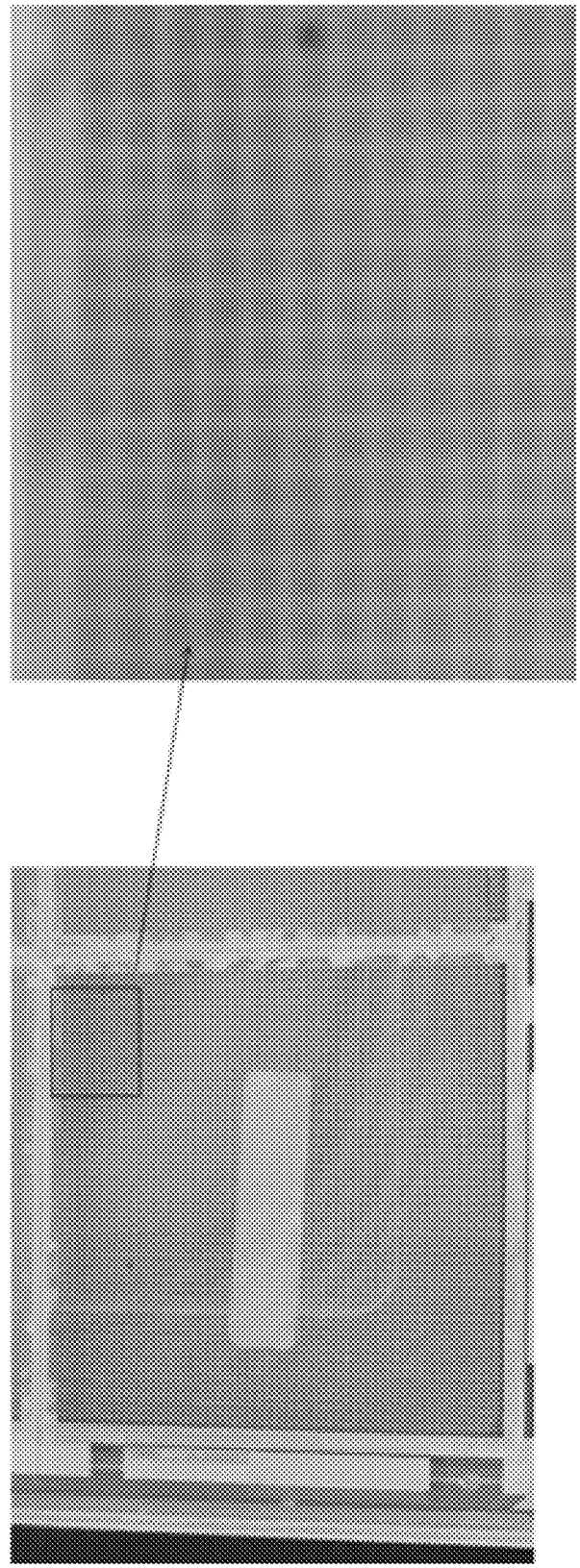
FIG. 11 shows photographs of an OLED device with topographical non-uniformity introduced in form of gold buslines covered by polyimide grid according to an embodiment of the invention.
Figure 12:
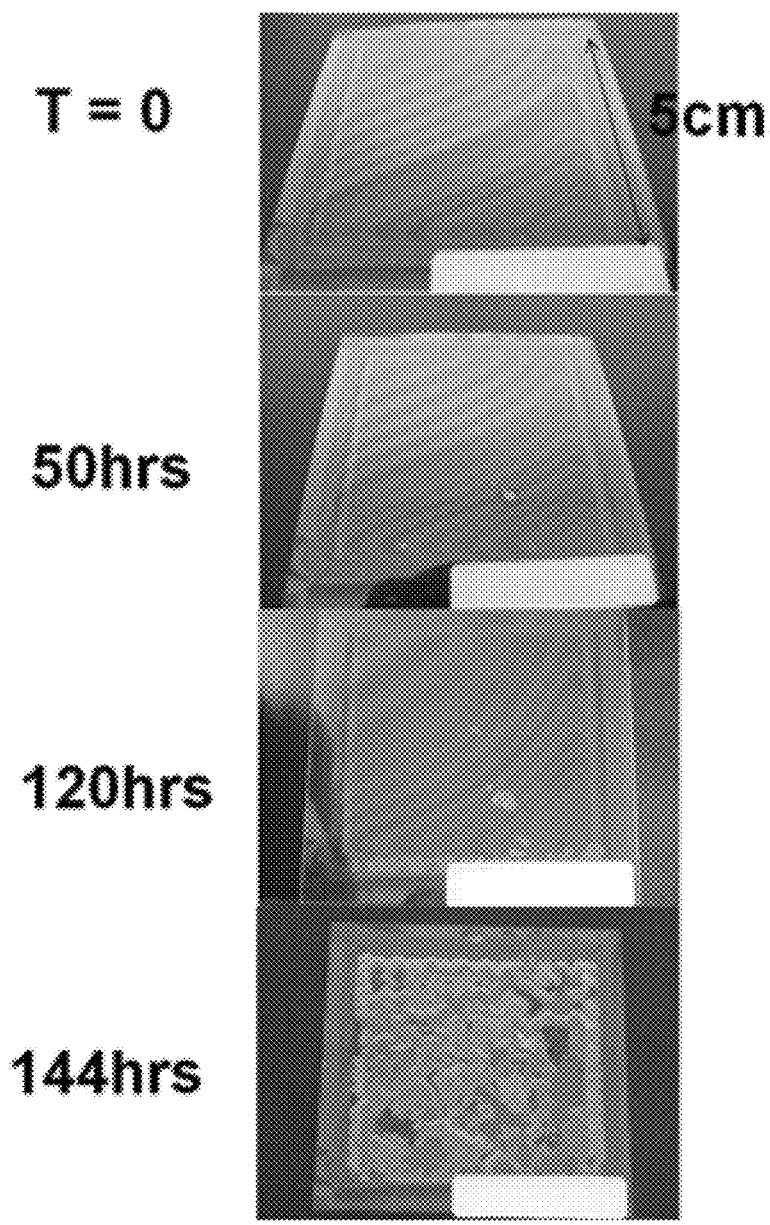
FIG. 12 shows photographs of an OLED device with no pixilation and all the layers blanket layers when stored after encapsulation at 60° C. and 90% RH according to an embodiment of the invention.
Figure 13:
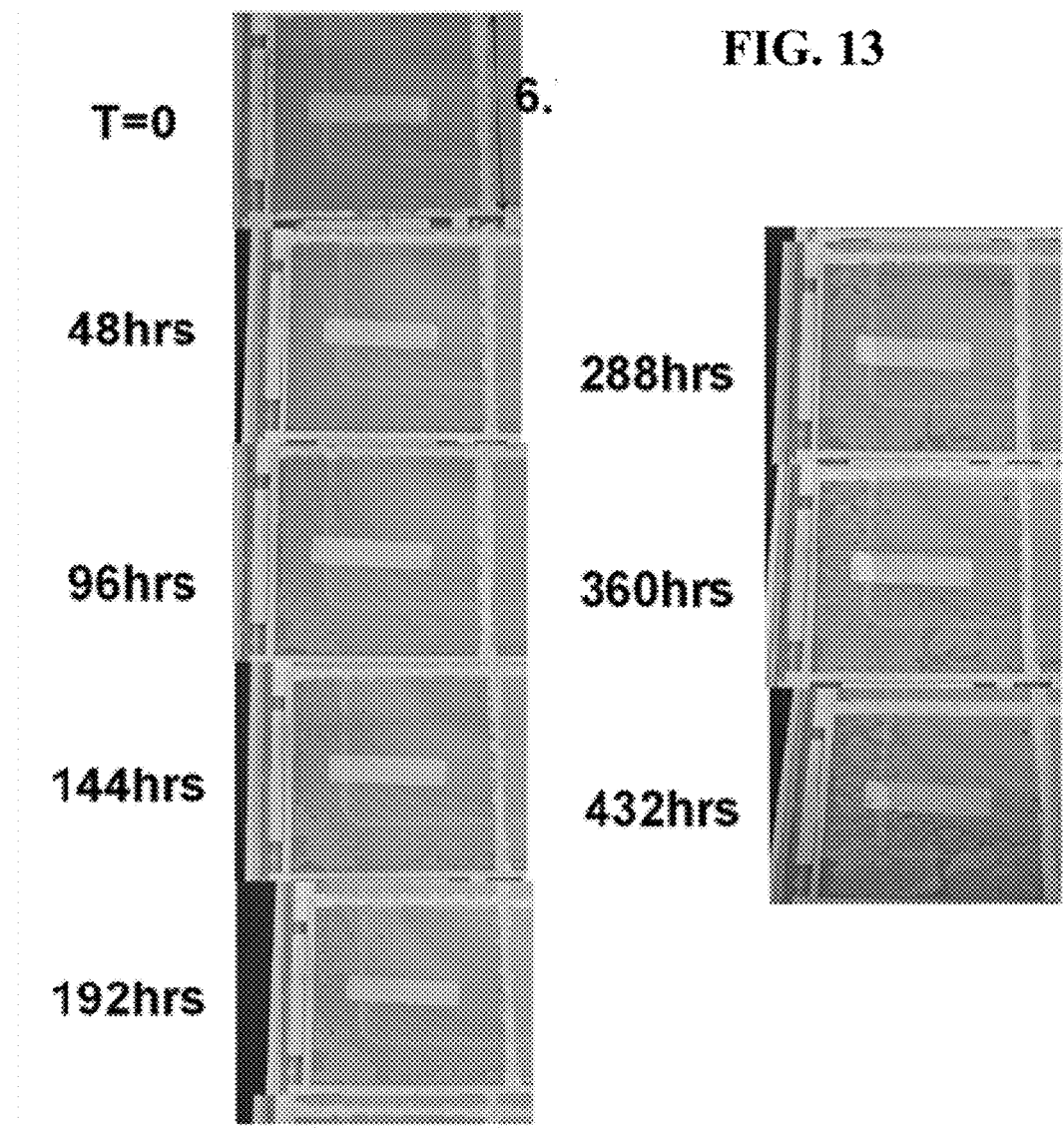
FIG. 13 shows photographs of OLED device with topographical non-uniformity introduced in form of gold buslines covered by polyimide grid when stored after encapsulation at 60° C. and 90% RH according to an embodiment of the invention.

Two devices were fabricated and tested. A first device was fabricated with all planar layers in the active area, such as illustrated in FIG. 3. This device included a grid at the edges to prevent shorting of the cathode to the anode. In the second device, gold buslines were disposed on top of the anode and covered by polyimide to pixelate the overall device. All other layers were blanket layers. FIG. 11 shows a photograph of the device. Both devices were conformally coated with a thin film barrier. The devices were after encapsulation, without any additional lamination layer on top, at 60° C. and 90% RH. FIGS. 12 and 13 show photographs of the two devices during the storage. The device in FIG. 12 (no grid) showed some delamination between 50 hrs and 120 hrs of storage but completely delaminated after 144 hrs. The pixelated device in FIG. 13, however showed signs of delamination starting close to 120 hrs but unlike the no-grid device, the spread of delamination was much slower in this case. The delamination did not spread through the entire device even after 432 hrs of storage. In both cases, the organic layer was exposed to the atmosphere at the edge (i.e., the barrier film did not cover it entirely), and the delamination in both cases started from the exposed organic region and then entered the device. The barrier layer and the OLED layers in both the cases were same.

Figure 14:
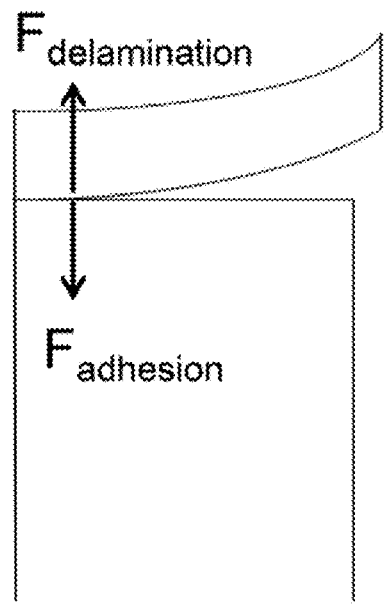
FIG. 14 shows a schematic cross-section of thin film delaminating from a substrate.
Figure 15:
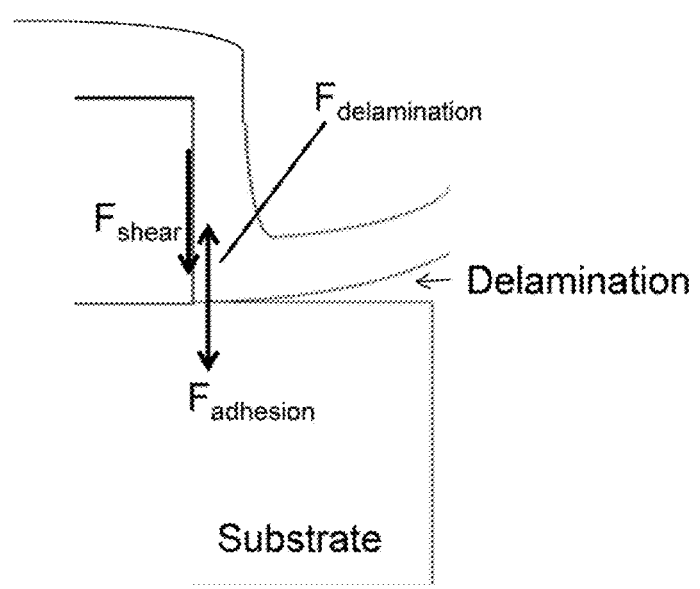
FIG. 15 shows a schematic cross-section of thin film delaminating from a substrate with a topographical non-uniformity according to an embodiment of the invention.

The effectiveness of topographical non-uniformities in minimizing the progress of delamination may be explained using a model of the progression of a delamination. FIG. 14 shows a schematic cross-section of a delamination of a thin film on a substrate and illustrates the forces acting on the interface between the film and the substrate. The force responsible for the delamination, $F_{delamination}$, may arise from multiple sources such as swelling of the organic material, formation of gas, and the like. The force which opposes the delamination is the adhesive force, $F_{adhesion}$, between the film and substrate. In the absence of an energy barrier to oppose the delamination, as soon as $F_{delamination} > F_{adhesion}$, the film starts to delaminate. When an energy barrier is present, such as when a topographical non-uniformity on the substrate surface is present, the situation is somewhat different. As shown in FIG. 15, for the film to delaminate just before the topographical non-uniformity, all the bonds between the film and the substrate on vertical wall of the non-uniformity have to break such as by a shear fracture. Such a fracture of the interface requires a much larger energy than the breaking of a few bonds in the case of normal delamination. A shear force, $F_{shear}$, also adds to the adhesive force to oppose the delamination. This is the energy barrier which will delay the progress of the delamination. In FIG. 15, the angle between the wall of the topographical non-uniformity is 90° with respect the plane of the substrate surface, though any other angle and geometry may be used. Such variations may affect the energy barrier and hence decide the extent to which the delamination can be delayed or controlled. For example, FIG. 10 shows an example in which the wall of the topographic non-uniformity 1010 forms an acute angle with the substrate 1001. In this case, the delamination of the film on the horizontal substrate will push the film on the wall against the wall, further preventing or reducing delamination. To most efficiently prevent delamination, the angle between the wall of the topographical feature and the substrate, with no topographical feature, is preferred to be around 90 degree or less.

As previously described, embodiments of the invention may use multiple topographic non-uniformities to prevent or reduce delamination. To preserve the topographical features even after the thin film barrier deposition, it may be preferred for the barrier to coat the topography conformally, such as shown in FIGS. 4-10 and 15. One such example of a conformally coated thin film barrier was disclosed by U.S. Pat. No. 7,968,146 to Wagner et. al, the disclosure of which is incorporated by reference in its entirety, in which a single layer barrier is deposited by a PECVD process.

Figure 16:
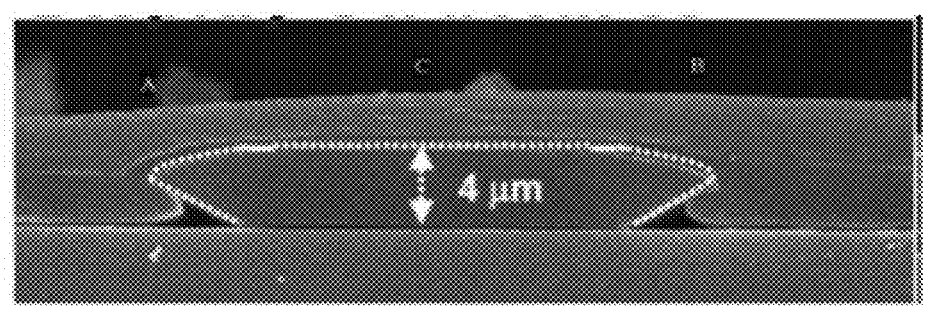
FIG. 16 shows a SEM cross-section of a planarization property of a multilayer barrier.

In multi-layer thin film encapsulation, such as an inorganic/polymer barrier layer stack, an inorganic/decoupling barrier layer stack, or the like, the organic layer may act as a planarization layer. In this case the topographic features of the non-uniformity may be compromised or smoothed out, thus reducing or removing the effectiveness of the non-uniformity as an energy barrier to prevent delamination, such as shown in FIG. 16. (McMahon, 2004, OLEDs Asia 2004)

Figure 17:
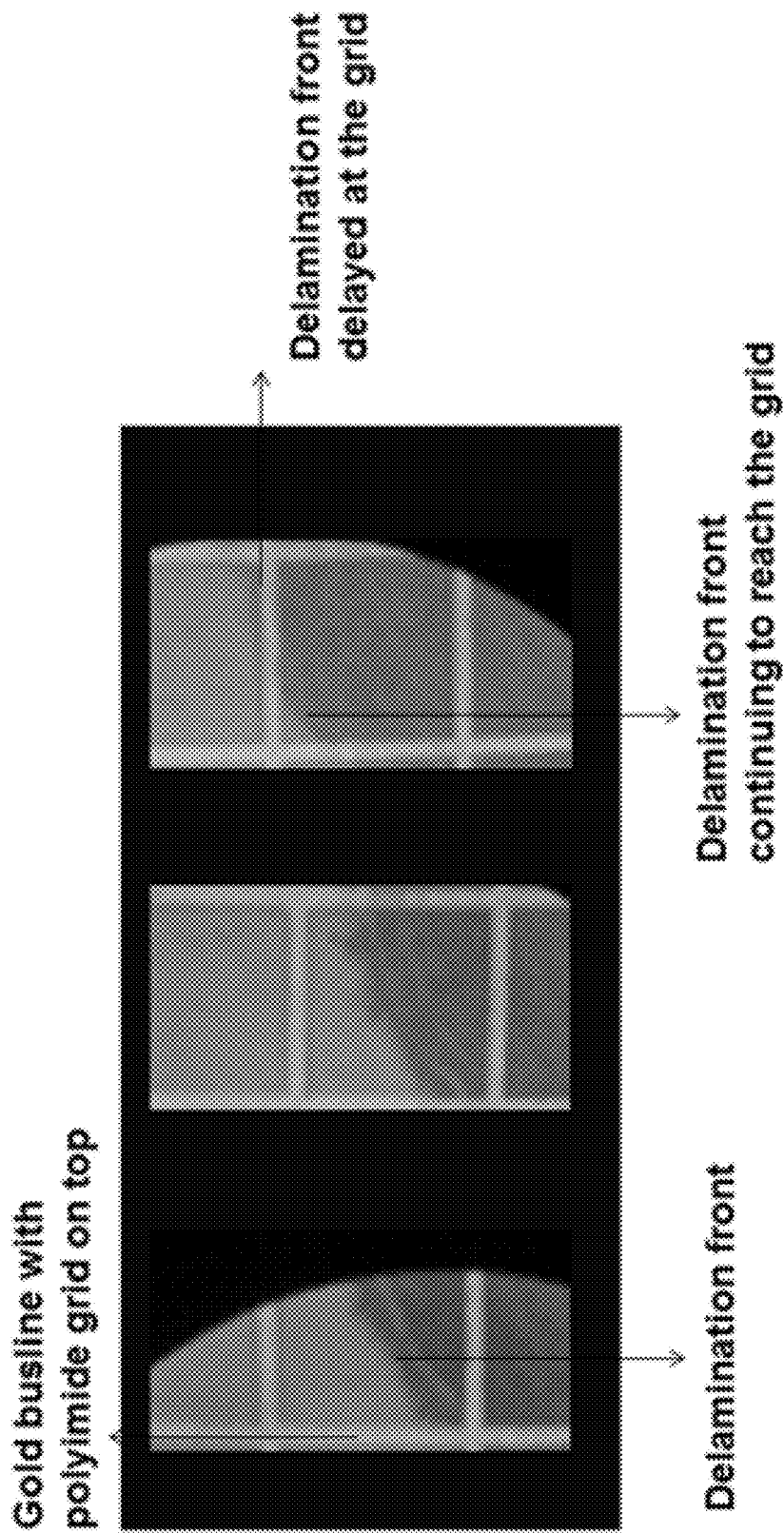
FIG. 17 shows an enlarged view of an OLED device as illustrated in FIGS. 11-13 with a topographical non-planar layer in the form of gold buslines covered by polyimide grid when stored after encapsulation at 60° C. and 90% RH according to an embodiment of the invention.

FIG. 17 shows an enlarged view of the progress of a delamination in the device of FIGS. 11-13. The pixel in the center is observed as a function of time of storage at 60° C. and 90% RH. From left to right is the progress of time of storage. In the left photograph, it is observed that the delamination covers less than half of the pixel. There is an observable curvature to the delamination front. In the central photograph, it is seen that the front has moved further in the pixel. In the right photograph, the front on the top has reached the grid (top edge of the pixel) but has not moved further. However, the pixel continues to become delaminated because of the progress of the front coming from the bottom of the pixel. The front on the top faces the energy barrier and is delayed (hence the top front becomes flat). Once the entire pixel is completely delaminated and the force is overwhelming, the front then will move on the neighboring pixel.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A device, comprising:
   a substrate;
   a first electrode disposed over the substrate;
   an organic emissive layer disposed over the first electrode;
   a second electrode disposed over the organic emissive layer;
   a barrier film disposed over the first electrode, the organic emissive layer, and the second electrode, and in conformal contact with a layer immediately below the barrier film, wherein the barrier film covers at least a portion of a side of the device; and
   a topographically non-planar layer disposed between the substrate and the barrier film, the non-planar layer comprising topographical non-uniformities that are energy barriers in a propagation path of a delamination region of the device;
   wherein both a first side of the barrier film closest to the substrate and a second side of the barrier film furthest from the substrate topographically follow the contour of the topographically non-planar layer, and
   wherein each layer disposed over the non-planar layer includes at least one side that topographically follows the contour of the non-planar layer.

2. The device of claim 1, wherein the non-planar layer is disposed between the first electrode and the organic emissive layer.

3. The device of claim 1, wherein the first electrode is an anode and the second electrode is a cathode.

4. The device of claim 1, wherein the non-planar layer is disposed between the substrate and the organic emissive layer.

5. The device of claim 1, wherein the non-planar layer is disposed adjacent to the organic emissive layer.

6. The device of claim 5, wherein the non-planar layer is disposed adjacent to the first electrode.

7. The device of claim 1, wherein the non-planar layer is disposed adjacent to the first electrode.

8. The device of claim 1, wherein the organic emissive layer comprises a plurality of pixels.

9. The device of claim 8, wherein the non-planar layer physically separates separate pixels within the organic emissive layer.

10. The device of claim 1, wherein the non-planar layer comprises a grid structure.

11. The device of claim 1, wherein the non-planar layer comprises at least one material selected from the group consisting of: a metal, an organic, and an inorganic.

12. The device of claim 1, wherein the non-planar layer is disposed between the first electrode and the organic emissive layer.

13. The device of claim 12, wherein the organic emissive layer is a blanket layer.

14. The device of claim 1, wherein the non-planar layer comprises a grooved layer.

15. The device of claim 1, wherein the non-planar layer is disposed immediately over the substrate.

16. The device of claim 15, wherein both a first side and a second side of each layer disposed over the non-planar layer topographically follows the contour of the non-planar layer.

17. The device of claim 1, wherein the non-planar layer comprises a topographical non-uniformity having a wall that makes an angle relative to the substrate of not more than 90 degrees.

18. The device of claim 17, wherein the non-uniformity is in physical contact with the substrate.

19. The device of claim 1, wherein the non-planar layer comprises a topographical non-uniformity having an upper portion that extends over and beyond a lower portion.

20. The device of claim 19, wherein the barrier film conformally coats the topographical non-uniformity.

21. The device of claim 19, wherein the organic emissive layer is disposed over the topographical non-uniformity.

22. The device of claim 21, wherein a region under the upper portion of the topographical non-uniformity is not filled by the organic emissive layer.

23. A device, comprising:
a substrate;
an anode disposed over the substrate;
a topographically non-planar layer disposed over the anode, the non-planar layer comprising topographical non-uniformities that are energy barriers in a propagation path of a delamination region of the device;
an organic emissive layer disposed over the non-planar layer;
a cathode disposed over the organic emissive layer; and
a barrier film disposed over and in conformal contact with the cathode, wherein the barrier film covers at least a portion of a side of the device;
wherein both a first side of the barrier film closest to the substrate and a second side of the barrier film furthest from the substrate topographically follow the contour of the topographically non-planar layer, and
wherein each layer disposed over the non-planar layer includes at least one side that topographically follows the contour of the non-planar layer.

24. The device of claim 1, wherein the topographically non-planar layer is a continuous layer disposed entirely between two other layers of the device.

25. The device of claim 1, wherein a portion of the barrier film and a portion of the topographically non-planar layer have the same distance from the substrate measured in a direction perpendicular to the substrate.

26. The device of claim 1, wherein the barrier film wraps around a part of the topographically non-planar layer.

27. The device of claim 23, wherein a portion of the barrier film and a portion of the topographically non-planar layer have the same distance from the substrate measured in a direction perpendicular to the substrate.

28. The device of claim 23, wherein the barrier film wraps around a part of the topographically non-planar layer.

* * * * *